(12) United States Patent
Tanaka et al.

(10) Patent No.: US 9,140,722 B2
(45) Date of Patent: Sep. 22, 2015

(54) CONTACT AND CONNECTOR

(71) Applicant: FUJITSU COMPONENT LIMITED, Tokyo (JP)

(72) Inventors: Tetsugaku Tanaka, Tokyo (JP); Koki Sato, Tokyo (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 209 days.

(21) Appl. No.: 13/826,647

(22) Filed: Mar. 14, 2013

(65) Prior Publication Data

US 2013/0265075 A1     Oct. 10, 2013

(30) Foreign Application Priority Data

Apr. 10, 2012 (JP) ................................. 2012-089449

(51) Int. Cl.
*G01R 31/02* (2006.01)
*H01R 13/05* (2006.01)
*G01R 1/067* (2006.01)

(52) U.S. Cl.
CPC ........ *G01R 1/06716* (2013.01); *G01R 1/06722* (2013.01)

(58) Field of Classification Search
CPC ........ G01R 1/067; G01R 31/00; G01R 31/02; H01R 13/05
USPC ........ 324/755.01, 755.05, 755; 439/482, 700, 439/824, 851, 862
See application file for complete search history.

(56) References Cited

U.S. PATENT DOCUMENTS

| | | | |
|---|---|---|---|
| 5,667,410 A * | 9/1997 | Johnston | 439/700 |
| 6,443,784 B1 * | 9/2002 | Kimoto | 439/862 |
| 7,201,617 B2 * | 4/2007 | Okamoto et al. | 439/851 |
| 2011/0050263 A1 * | 3/2011 | Sato et al. | 324/755.05 |
| 2011/0057675 A1 * | 3/2011 | Kim et al. | 324/755.01 |
| 2011/0241715 A1 * | 10/2011 | Huang et al. | 324/755.05 |

FOREIGN PATENT DOCUMENTS

JP     2007-024664     2/2007

* cited by examiner

*Primary Examiner* — Arleen M Vazquez
*Assistant Examiner* — Neel Shah
(74) *Attorney, Agent, or Firm* — IPUSA, PLLC

(57) ABSTRACT

A contact for electrically connecting two electric components, includes a first end portion which contacts an object to be contacted; a second end portion for passing a signal from the first end portion; an elastic portion which connects the first end portion with the second end portion while pushing the first end portion and the second end portion in an opposing direction, the elastic portion having a meandering shape from the first end portion to the second end portion and having a curved/bent structure provided with an open portion where a width of the open portion is different from the maximum inner width of the curved/bent structure of the elastic portion when seen from the opposing direction; and a housing portion which surrounds the elastic portion, wherein the first end portion, the second end portion, the elastic portion and the housing are formed by bending a single conductive plate.

17 Claims, 12 Drawing Sheets

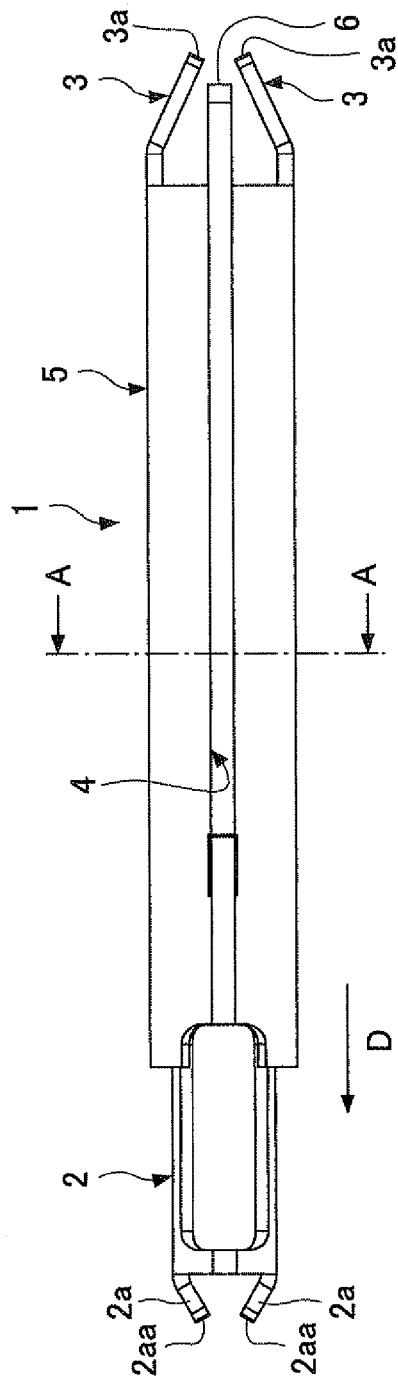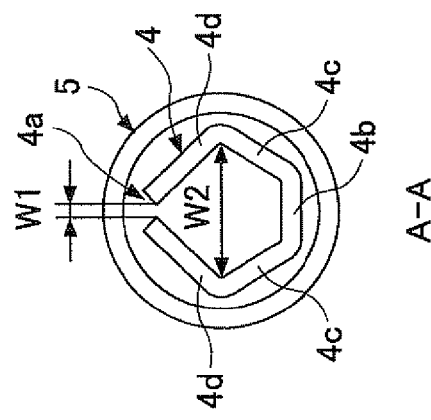
FIG.1A
FIG.1B

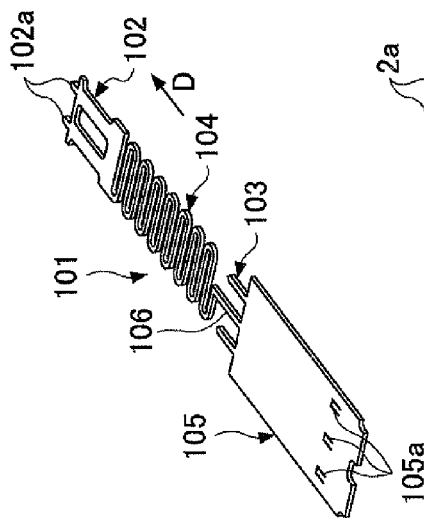
FIG.2A
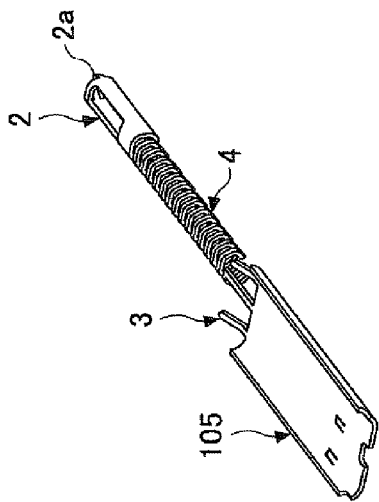
FIG.2D
FIG.2B
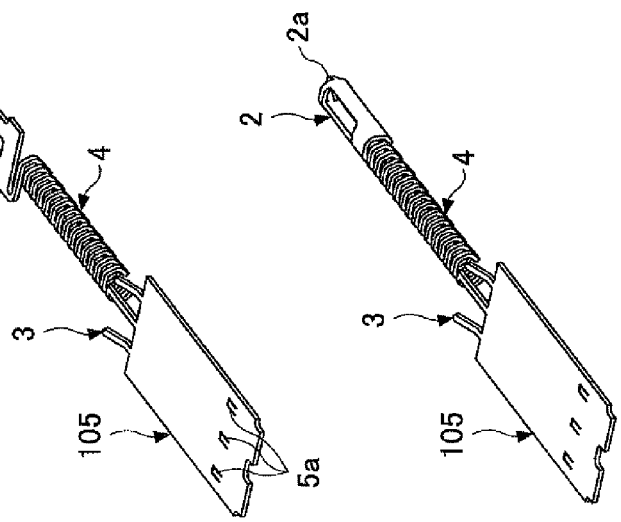
FIG.2E
FIG.2C
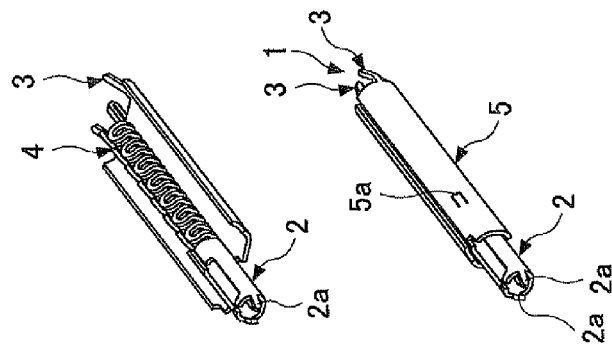
FIG.2F "2" may be a polygonal shape

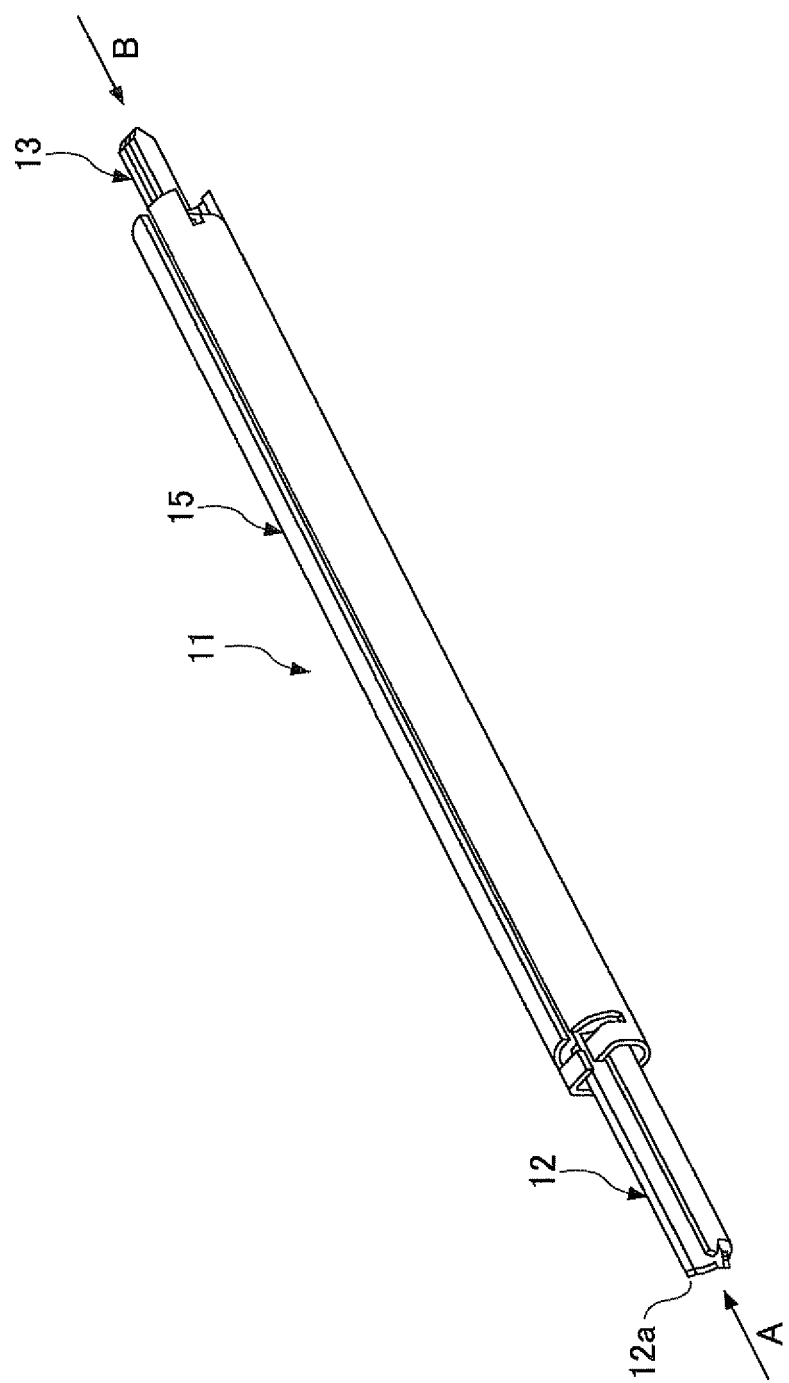

CONTACT AND CONNECTOR

BACKGROUND OF THE INVENTION

1. Field of the Invention

The present invention relates to a contact and a connector including the contact.

2. Description of the Related Art

A test device for measuring or testing electric characteristics of the semiconductor integrated circuit or the like formed on a wafer is used when manufacturing a semiconductor integrated circuit or the like, for example. With such a test device, contacts are contacted with electrode pads or electrode terminals formed on the wafer for electrically connecting the test device with the semiconductor integrated circuit or the like to conduct an electrical measurement.

Patent Document 1 discloses a coil spring probe including a contact pin and a tubular housing, as such a contact. The contact pin includes a contacting end which contacts an electrical pad of a semiconductor integrated circuit and a guide member which is inserted in the housing. Further, a part of the housing is formed as a coil spring.

In this coil spring probe, by providing the coil spring, the contacting end of the contact pin is extensible and the electrical connection with the electrode pad can be ensured.

By including plural of such contacts in an insulating body, a connector for electrical connection can be structured.

However, the coil spring probe disclosed in Patent Document 1 includes many components such as the contact pin and the housing, and it is necessary to manufacture each of the components and to assemble the components. Thus, a manufacturing process becomes complicated, leading to higher cost.

Patent Document

[Patent Document 1] Japanese Laid-open Patent Publication No. 2007-24664

SUMMARY

According to an embodiment, there is provided a contact for electrically connecting two electric components, including a first end portion which contacts an object to be contacted; a second end portion for passing a signal from the first end portion; an elastic portion which connects the first end portion with the second end portion while pushing the first end portion and the second end portion in an opposing direction, the elastic portion having a meandering shape from the first end portion to the second end portion and having a curved/bent structure provided with an open portion where a width of the open portion is different from the maximum inner width of the curved/bent structure of the elastic portion when seen from the opposing direction; and a housing portion which surrounds the elastic portion, wherein the first end portion, the second end portion, the elastic portion and the housing are formed by bending a single conductive plate.

According to another embodiment, there is provided a connector including a plurality of the above contacts.

Note that also arbitrary combinations of the above-described constituents, and any exchanges of expressions in the present invention, made among methods, devices and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

FIG. 1A is a plan view showing an example of a contact of an embodiment

FIG. 1B is a cross-sectional view of the contact of the embodiment taken along an A-A line in FIG. 1A;

FIGS. 2A to 2F are perspective views showing an example of a manufacturing process of the contact of the embodiment;

FIG. 7A to FIG. 7D are views showing an example of a contact of another embodiment;

DESCRIPTION OF EMBODIMENTS

Figure 3A:
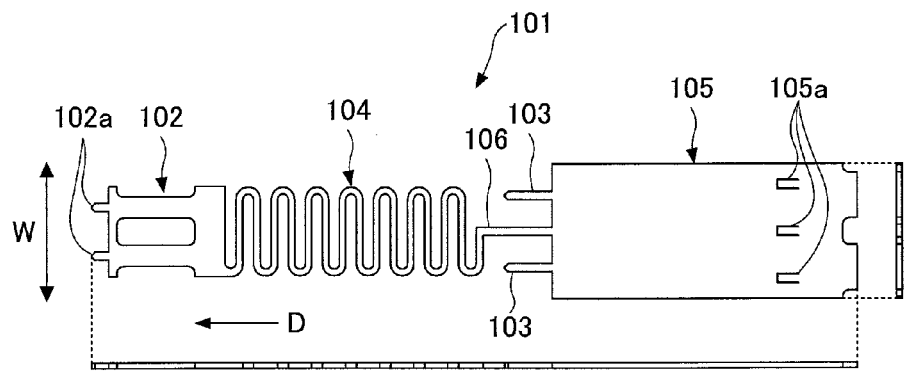
FIGS. 3A to 3F are views showing an example of the manufacturing process of the contact of the embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(First Embodiment)

FIG. 1A is a plan view showing a contact of an embodiment. The contact 1 is used for testing an electronic component, an electrical circuit or the like and has a function to electrically connect an electrode terminal such as an electrode pad, a Ball Grid Alley (BGA) or the like formed on an electronic component, an electrical circuit or the like with a substrate at a test device side.

The contact 1 of the embodiment includes a first end portion 2, a pair of second end portions 3, an elastic portion 4, a housing portion 5 and a connecting portion 6.

Figure 4:
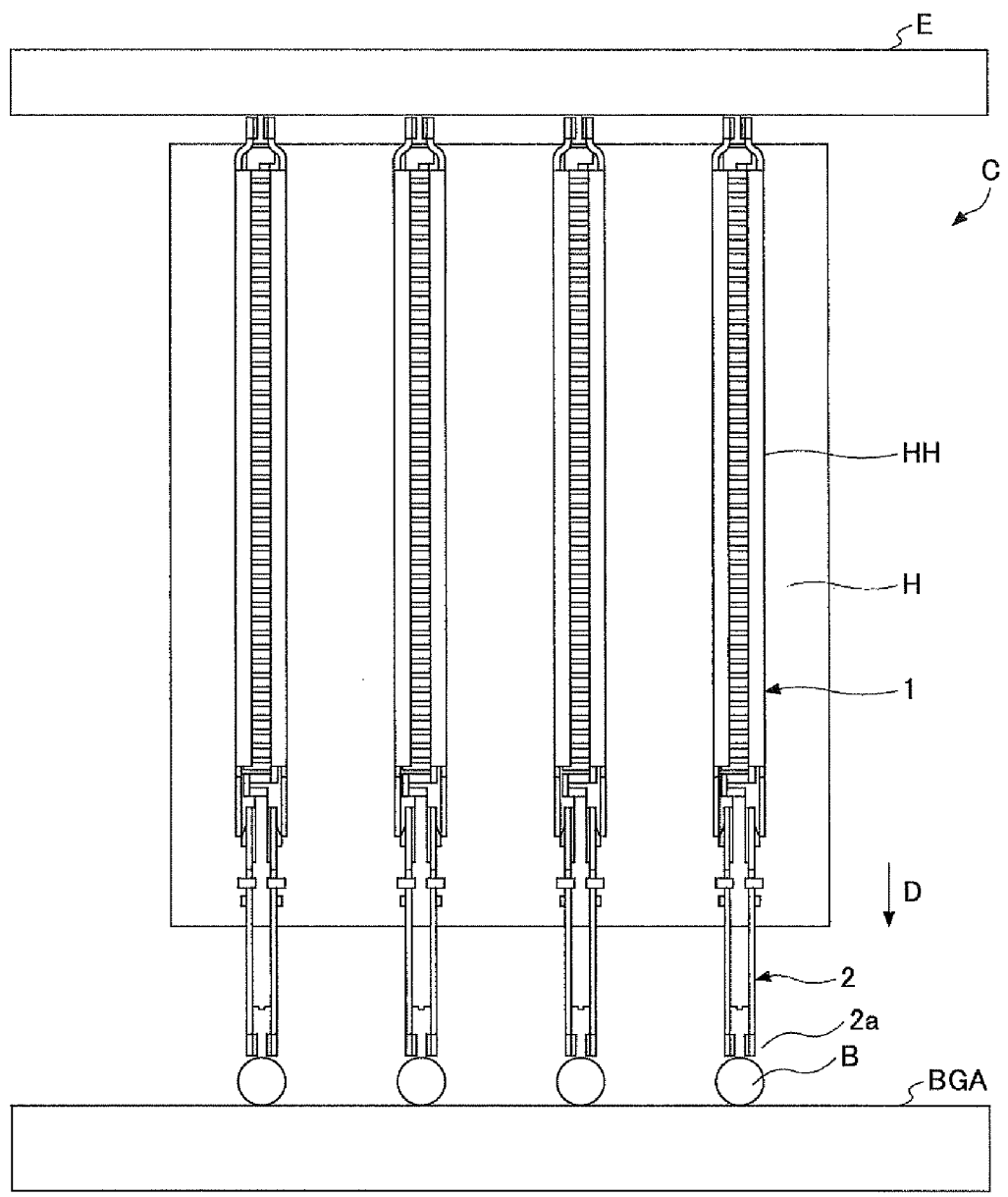
FIG. 4 is a schematic view showing an example of a connector including the plural contacts of the embodiment.

FIG. 4 is a view showing an embodiment of a connector C including plural of the contacts 1. The connector C includes a housing H provided with plural circular holes HH in each of which the housing portion 5 of the contact 1 is housed and attached.

The first end portion 2 of each of the contacts 1 has a function to contact a soldering ball B of the BGA formed on a wafer or the like so that a pad or the like (not shown in the drawings) formed on a substrate E of a test device is electrically connected to the soldering ball B.

The first end portion 2 is provided with a pair of contacting portions 2a at an end (see also FIG. 1A). The contacting portions 2a directly contact the respective soldering ball B.

FIG. 2A to FIG. 2F are perspective views showing an example of a manufacturing process of the contact 1 of the embodiment. FIGS. 3A to 3F correspond to FIGS. 2A to 2F, respectively. Each of 3A to 3F includes a plan view, a lateral side view seen in an opposing direction D from a left side of the plan view (at a right side) and a longitudinal side view seen from a lower side of the plan view (at a lower side), based on trigonometry.

As will be explained in the following, the contact 1 is manufactured by firstly forming a metal plate 101 (see FIG. 2A and FIG. 3A) having a predetermined shape in a plan view by a press working or an etching process, not shown in the drawings, and then bending predetermined position of the metal plate 101, respectively, as shown in FIGS. 2B to 2F and FIGS. 3B to 3F to be the structure shown in FIG. 2F. The contact 1 is integrally formed by a single metal plate.

As shown in FIGS. 2A and 3A, the metal plate 101, which is a single plate, made of copper or an alloy including copper, for example, is prepared by a press working, an etching process or the like. The metal plate 101 is formed to include a first end part 102, a pair of second end parts 103, an elastic part 104, a housing part 105 and a connecting part 106. The first end part 102, the second end parts 103, the elastic part 104, the housing part 105 and the connecting part 106 are parts correspond to the first end portion 2, the pair of second end portions 3, the elastic portion 4, the housing portion 5 and the connecting portion 6 shown in FIG. 1, respectively.

As shown in FIGS. 2A and 3A, the elastic part 104 which becomes the elastic portion 4 has a meandering shape which has U shapes from an end portion of the connecting portion 106 which protrudes from the housing part 105 toward the first end part 102 in the direction D.

The pair of second end parts 103 are formed to protrude in parallel in the direction D from the housing part 105. The first end part 102 is provided with two contacting parts 102a which protrude in parallel in the direction D. The housing part 105 is provided with three protruding portions 105a to be a stopper.

Then, the elastic part 104 is bent at four points in a width direction W in the plan view to have a pentagon shape in the lateral side view (in a cross-sectional view seen from the direction D) to form the elastic portion 4. With this structure, as the elastic portion 4 has the meandering shape including plural U shapes at the ends in the width direction W, elastic portion 4 is capable of having an elasticity.

With this structure, the elastic portion 4 functions as a spring mainly pushing the first end portion 2 with respect to the second end portions 3 in the direction D which is apart from the second end portion 3.

FIG. 1B is a cross-sectional view of the contact 1 taken along an A-A line in FIG. 1A.

With reference to FIG. 1B, the elastic portion 4 (the elastic part 104) is bent at four points including two points between a bottom surface 4b and sides 4c and two points between the sides 4c and sides 4d, respectively to have a curved/bent structure provided with an open portion 4a at a point between the sides 4d. The width W1 of the open portion 4a is set to be different from the maximum inner width W2 in the pentagonal shape of the elastic portion 4. For the case shown in FIG. 1B, the width W1 of the open portion 4a is set to be smaller than the maximum inner width W2 of the elastic portion 4.

The pentagonal shape of the elastic portion 4 may be formed by bending the two points between the bottom surface 4b and the sides 4c using a die having obtuse angled edges, for example, inserting a jig having a pentagonal prism structure to be a position contacting the bottom surface 4b in accordance with a necessity, and then contracting both sides of the elastic part 104 in a returning direction of the meandering shape, which is perpendicular to the direction D, toward a position where the open portion 4a is to be formed by pressing the both sides of the elastic part 104 using a jig having a pair of clipping surfaces. With this operation, bending lines are formed between the bottom surface 4b and the sides 4c and between the sides 4c and the sides 4d, respectively.

Referring back to FIGS. 2A, 3A, 2B and 3B, the contacting parts 102a are bent in a direction in which the parts of the elastic portion 4 other than the bottom surface 4b protrude with respect to the bottom surface 4b to be the contacting portions 2a.

The second end parts 103 are bent in a direction opposite to the direction in which the parts of the elastic portion 4 other than the bottom surface 4b protrude with respect to the bottom surface 4b to be the second end portions 3.

Figure 3B:
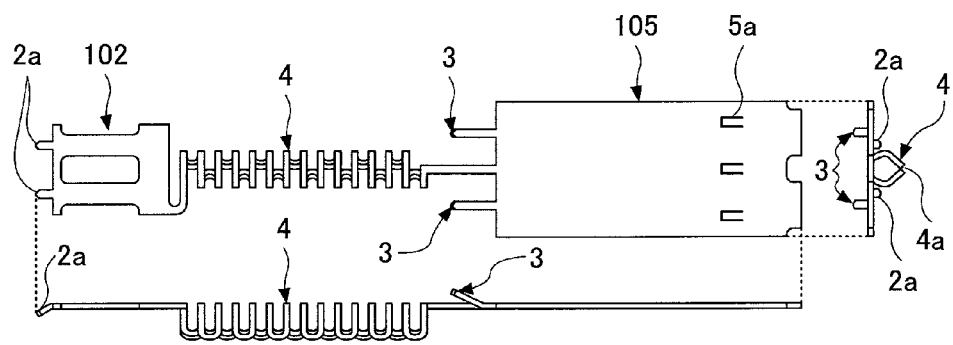
Figure 3C:
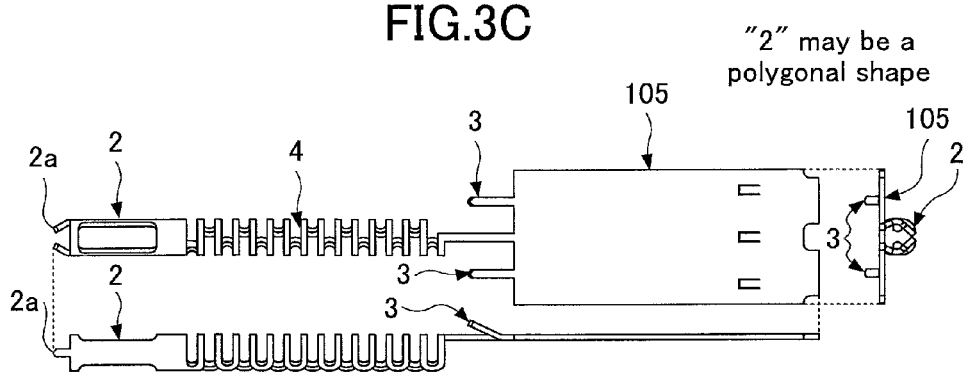

Then, the main body of the first end portion 2, the part other than the pair of contacting portions 2a, is curved to have a cylinder shape having a center line extending in parallel with the direction D as shown in FIGS. 2C and 3C. The cylindrical shape of the main body of the first end portion 2 is formed to correspond to the pentagonal shape of the elastic portion 4.

Figure 3D:
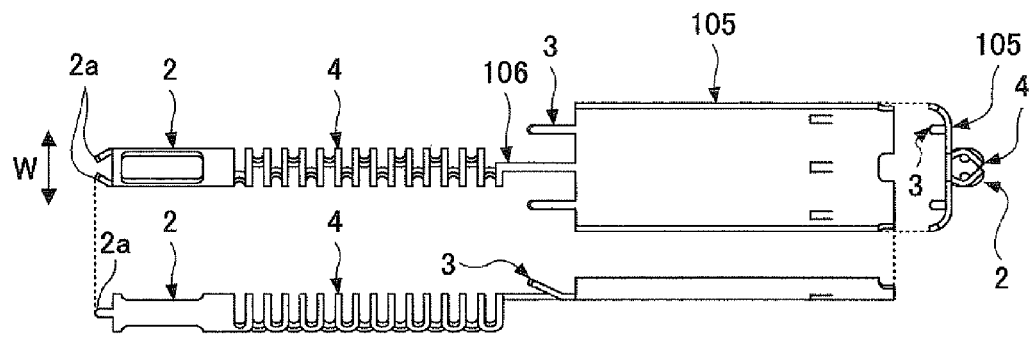

Thereafter, both end portions of the housing part 105 in the direction W are curved as shown in FIGS. 2D and 3D.

Figure 3E:
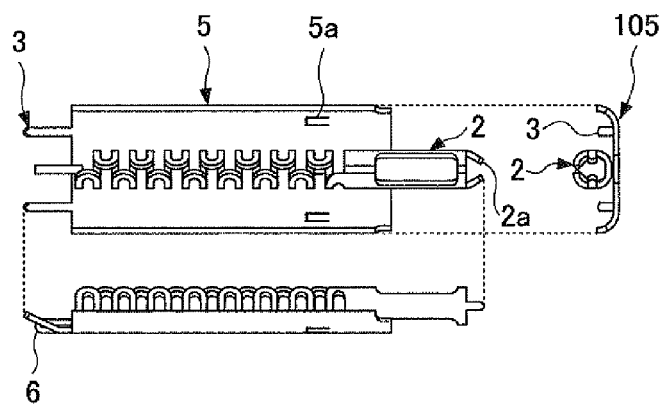

Then, the connecting portion 106 is bent 180 degree at a middle point in the direction D as shown in FIGS. 2E and 3E.

Figure 3F:
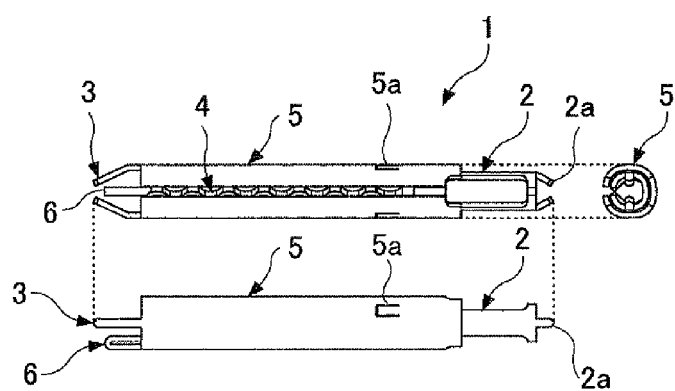

Subsequently, both end portions of the housing part 105 in the direction W are curved as being pressed in a direction that a distance between the both end portions becomes small to form the housing portion 5 as shown in FIGS. 2F and 3F. The housing portion 5 is formed to surround the entirety of the elastic portion 4.

Although not shown in the drawings, the three protruding portions 105a are bent in the direction in which the parts of the elastic portion 4 other than the bottom surface 4b protrude with respect to the bottom surface 4b in FIGS. 2B and 3B to form the stopper which engages the circular hole HH of the housing H shown in FIG. 4.

Here, as described above, the housing portion 5 and the elastic portion 4 are bent 180 degrees at the connecting portion 6, which is an interface between the housing portion 5 and the elastic portion 4, and the elastic portion 4 is housed in the housing portion 5. The connecting portion 6 is capable of functioning as a terminal which is electrically connected to the test device such as a prober or the like in addition to the second end portions 3. An electrode signal obtained at the contacting portions 2a by contacting the electrode pad or the electrode terminal is transmitted to the test device via the first end portion 2 and the second end portions 3.

In addition, in the contact 1 of the embodiment, the pair of contacting portions 2a is bent from the first end portion 2 in a direction being close to each other. Thus, as shown in FIG. 1A, the contacting portions 2a are formed to have a tapered structure. Therefore, when the object to be contacted is the soldering ball B having a curved surface, the end surfaces 2aa are capable of contacting at different points of the curved surface to ensure the electrical connection.

Similarly, according to the contact 1 of the embodiment, the second end portions 3 are bent from the housing portion 5 in a direction being close to each other. Thus, as shown in FIG. 1A, the second end portions 3 are formed to have a tapered structure. Therefore, when the substrate E of the test device includes soldering balls B, the pair of end surfaces 3a are capable of contacting two different points of a curved surface of the respective soldering ball B to ensure the electrical connection.

Further, in the contact 1 of the embodiment, the first end portion 2 is formed to have a cylindrical outer peripheral shape. Thus, the rigidity of the first end portion 2 which protrudes from the connector C can be increased, especially durability against a force in a lateral direction (the direction perpendicular to the direction D) applied when cleaning using a brush or the like can be increased.

Further, the shape of the elastic portion 4 when seen in the direction D, in other words, a cross-sectional view taken along a line in a direction perpendicular to the direction D, is exemplified to have a pentagonal shape in the first embodiment. The shape of the elastic portion 4 may be varied, provided that the elastic portion 4 has a curved/bent structure with an open portion like the open portion 4a shown in FIG. 1B. Here, the "curved/bent structure" means a circular shape or a polygonal shape provided with an open portion in the cross-sectional view.

Figure 5A:
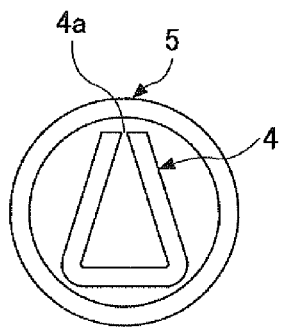
FIGS. 5A to 5E are cross-sectional views showing other examples of an elastic portion of the embodiment.
Figure 5B:
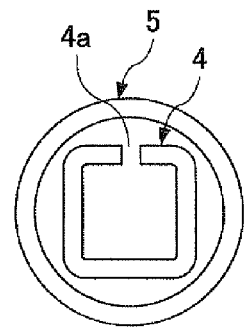
Figure 5C:
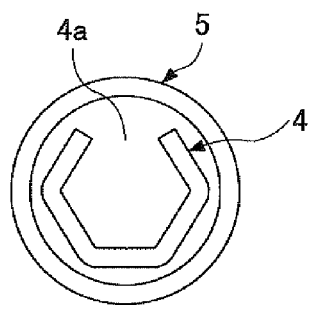
Figure 5D:
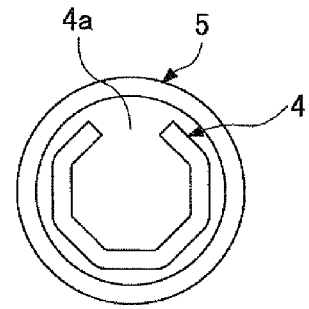
Figure 5E:
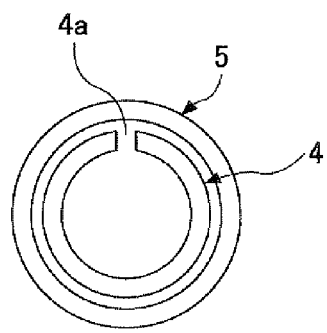
Figure 5F:
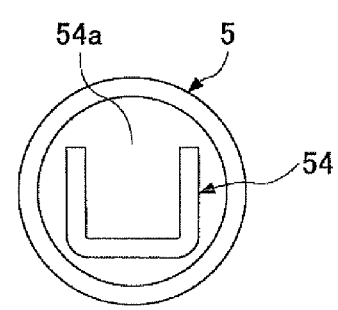
FIG. 5F is a cross-sectional view showing a reference example of an elastic portion.

The elastic portion 4 may be formed to have a triangular shape as shown in FIG. 5A, a tetragonal shape as shown in FIG. 5B, a pentagonal shape with the open portion 4a having a larger width than that shown in FIG. 1B, a hexagonal shape as shown in FIG. 5D, or a circular shape as shown in FIG. 5E. FIG. 5F shows a reference example in which an elastic portion 54 is formed to have a U shape in which the width of an open portion 54a is equal to the maximum inner width of the elastic portion 54.

Here, the length of the elastic portion 4 in the cross-sectional direction corresponds to the length of the elastic portion 4 (elastic part 104) in the direction W shown in FIG. 3A. As the elastic force applied by the elastic portion 4 becomes an inverse proportion of the length of the elastic portion 4 in the cross-sectional view in FIG. 1B, or FIGS. 5A to 5F, by arbitrary setting the length of the elastic portion 4 in the direction W, the spring force of the elastic portion 4 can be easily set. Then, the shape of the elastic portion 4 in the cross sectional view may be determined such that the elastic portion 4 can be appropriately housed in the housing portion 5 based on the length of the elastic portion 4 in the direction W.

In any of the examples shown in FIGS. 5A to E, compared with the structure shown in FIG. 5F, the length of the elastic portion 4 in the direction W (see FIG. 3A) can be freely selected. For example, the elastic portion 4 may have a cross-sectional shape where the width of the open portion of the elastic portion 54 shown in FIG. 5F to have wider width than the maximum inner width of the elastic portion 54 other than the open portion as an alternative example.

The contact 1 of the first embodiment can be used in the connector C which is used for a memory tester, a test of a liquid crystal panel, a contact for testing a substrate or the like and can be used instead of a contact pin or so-called "spring pin".

The method of manufacturing the contact 1 is explained in the following.

First, the metal plate 101 is formed to have a predetermined shape as shown in FIG. 2A and FIG. 3A. The metal plate 101 may be formed by punching a metal plate such as a press working or the like, by etching a metal plate with a mask having the predetermined shape so that the area not being covered by the mask is removed, or the like. The metal plate 101 is made of copper, an alloy including copper or the like, and the thickness is appropriately determined. Then, the metal plate 101 is plated. The plating of Ni, Pd and Au may be performed in this order, for example, or the plating of Ni and Au may be performed in this order.

With the above processes, the contact 1 of the embodiment is manufactured by processing the single metal plate 101. Thus, it is unnecessary to assemble plural parts to form the contact 1 having the spring function.

Further, as the manufacturing of the contact 1 only includes a processing of the metal plate such as a press working or the like and a plating and bending, the contact 1 can be manufactured by a simple manufacturing apparatus so that the manufacturing of the contact is also simplified and a large amount of the contacts 1 can be manufactured with a lower cost within a short period of time. Thus, the contact 1 having the spring function can be manufactured with a lower cost.

Figure 6:
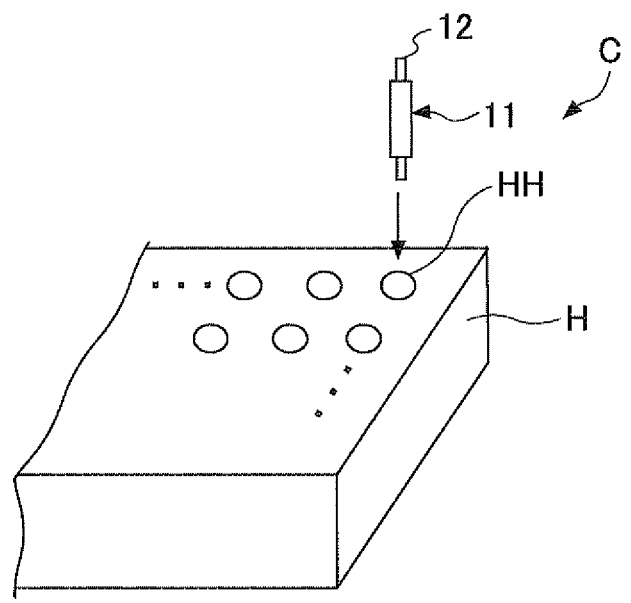
FIG. 6 is a schematic view showing the contact and a housing of the embodiment.

Further, according to the contact 1 of the embodiment, the outer peripheral shape of the housing portion 5 can be formed to have a polygonal shape having more sides than the tetragonal shape or a circular shape (circular tubular). Thus, as shown in FIG. 6, the circular holes HH can be provided to the housing H. The circular holes HH can be formed by an end mill so that the cost can be reduced compared with a case when the housing is provided with angular holes using a mold die.

(Second Embodiment)

In the first embodiment, the pair of contacting portions 2a is formed such that the end portions are bent in directions to be closer with each other to ensure the contact connection with the soldering ball B. In the second embodiment, plural contacting portions 2a are formed to be positioned on a periphery of a circle to ensure the contact connection.

FIG. 7A is a perspective view showing a contact 11 of the second embodiment.

The contact 11 of the second embodiment includes a first end portion 12, a pair of second end portions 13, and a housing portion 15, which are basically the same as the first end portion 2, the pair of second end portions 3 and the housing portion 5 of first embodiment. In FIG. 7A, a direction B corresponds to the direction shown as the direction D in the first embodiment and a direction A is opposite to the direction B.

Figure 7B:
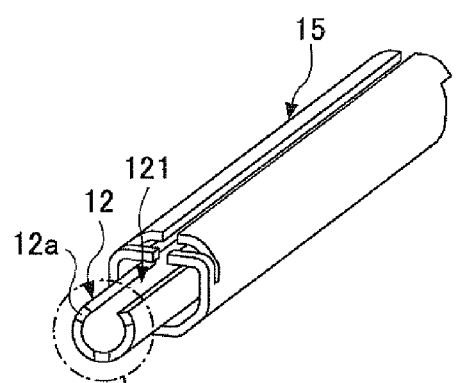
Figure 7B:
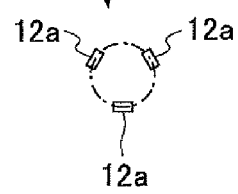
Figure 7C:
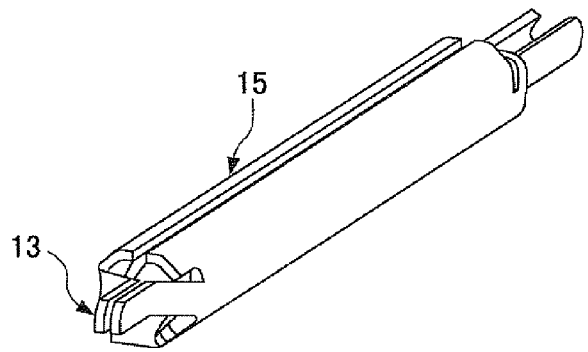

FIG. 7B is a perspective view showing the contact 11 of the embodiment seen in the direction A in FIG. 7A, and FIG. 7C is a perspective view showing the contact 11 of the embodiment seen in the direction B in FIG. 7A. In FIG. 7B, an enlarged view of the parts encircled by a dotted line is also shown.

As shown in FIG. 7B, the first end portion 12 of the contact 11 of the embodiment has a cylinder surface formed in a curved shape as a base to have a circular arc provided with an open portion 121 at a part. As shown in FIG. 7A and FIG. 7B, the first end portion 12 is provided with the contacting portions 12a which protrude in the direction B from the main body of the first end portion 12 with an equal interval along a circumferential direction of the first end portion 12.

As shown in FIG. 7C, the pair of second end portions 13 provided at an end portion of the housing portion 15 is formed to be close with each other in the direction A to be in contact with each other. Thus, the end portion of the pair of second end portions 13 is formed to have a rectangular shape in a cross-sectional view to be protruded from the housing 15.

In the contact 11 of the embodiment, the contacting portions 12a are provided along a circumferential direction of the circular shaped first end portion 12 to have the equal interval there between. Thus, when the object to be contacted is the soldering ball B having a curved surface, the contacting portions 12a are capable of contacting at different points of the curved surface to ensure the electrical connection.

Meanwhile, for the second end portions 13, by forming the second end portions 13 to have the above described protruded rectangular shape, when the substrate E of the test device is provided with through holes, for example, the second end portions 13 can be easily inserted into the respective through hole while contacting the inner side surface of the through hole by four corners of the rectangular shaped portion to ensure the contact connection.

Figure 7D:
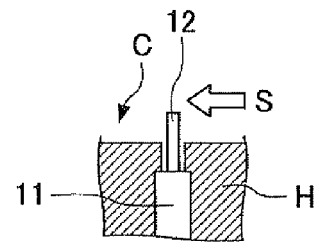

Further, as shown in FIG. 7D, the rigidity of the first end portion 12 against an external force S can be increased by a cross-sectional secondary moment to increase durability when cleaning using a brush or the like.

(Third Embodiment)

In the third embodiment, contacting portions 2a are formed to have a circular arc shape, respectively, along an outer periphery of a circle to ensure the contact connection.

Figure 8:
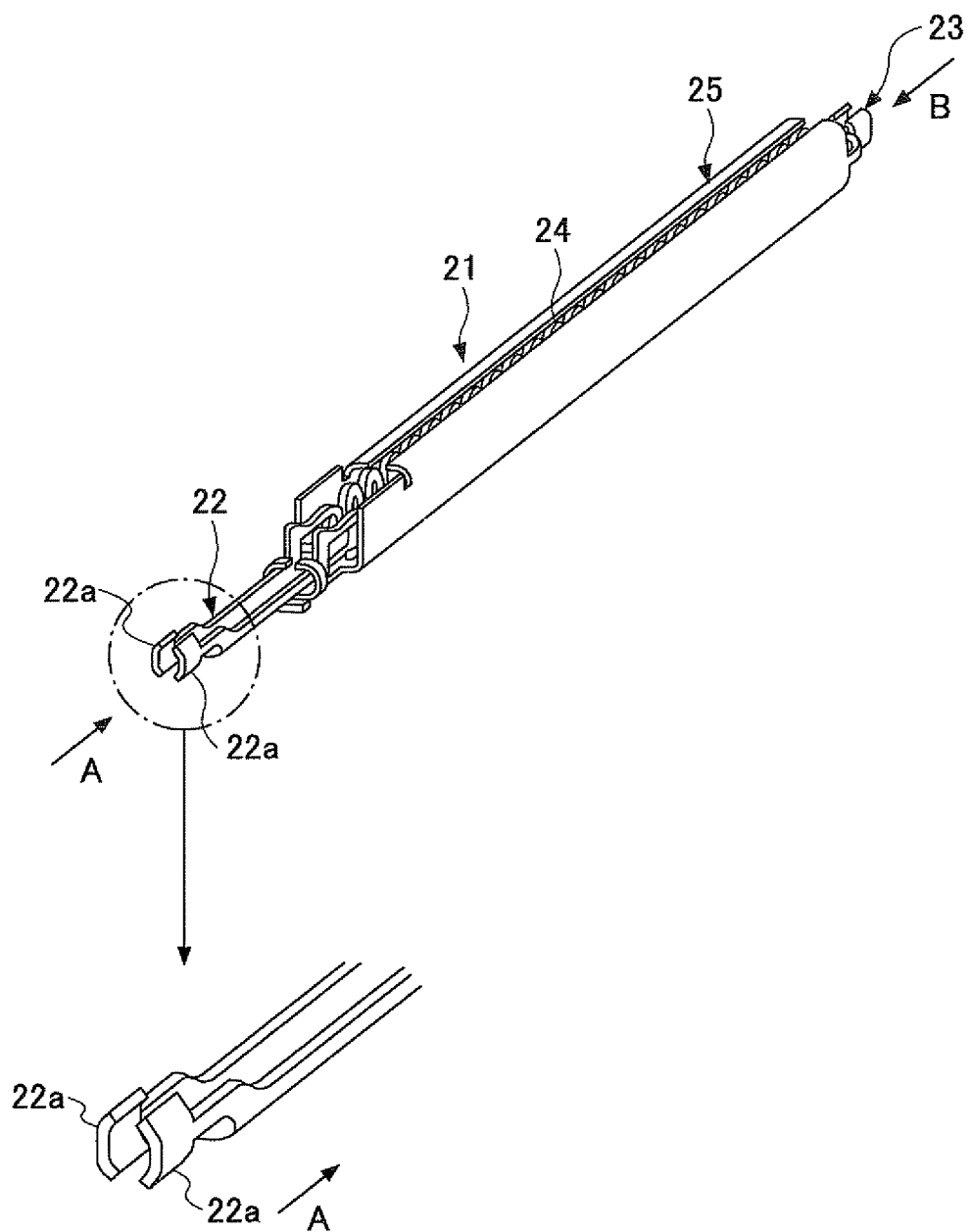
FIG. 8 is a perspective view showing an example of a contact of another example.
Figure 9:
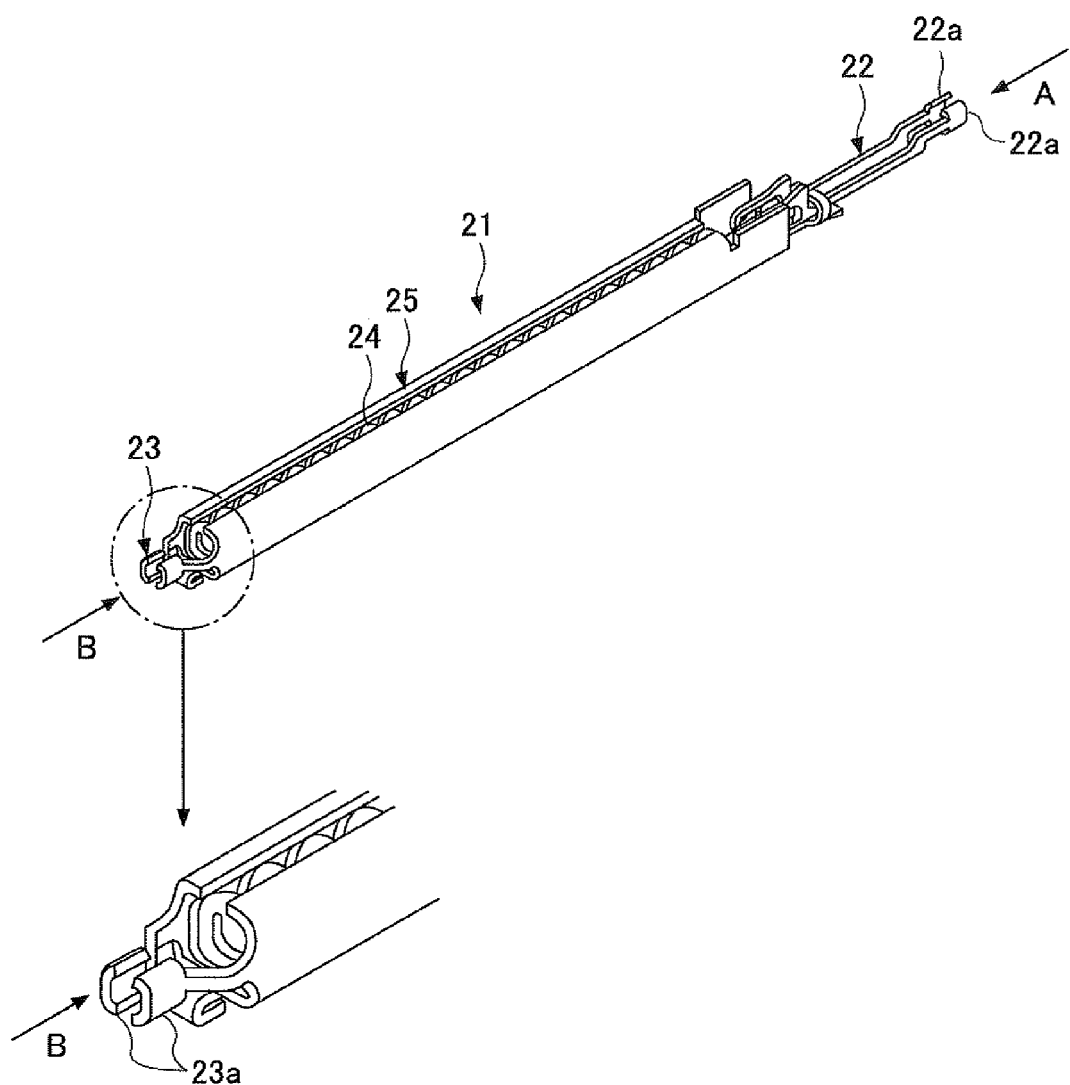
FIG. 9 is a perspective view showing an example of the contact of the example.

FIG. 8 and FIG. 9 are perspective views showing a contact 21 of the third embodiment.

The contact 21 of the third embodiment includes a first end portion 22, second end portions 23, an elastic part 24 and a housing portion 25, which are basically the same as the first end portion 2, the second end portions 3 and the housing portion 5 of first embodiment. In FIG. 8 and FIG. 9, a direction B corresponds to the direction shown as the direction D in the first embodiment and a direction A is opposite to the direction B.

As shown in FIG. 8, the first end portion 22 of the contact 21 of the embodiment is provided with a pair of contacting portions 22a each having a partial circular arc shape protruded in the direction B. The pair of contacting portions 22a is formed to be offset with respect to a base portion of the first end portion 22 other than the contacting portions 22a in order to correspond to the respective soldering ball B.

As shown in FIG. 9, the pair of second end portions 23 provided at an end portions of the housing portion 25 of the embodiment are provided with a pair of end portions 23a each being formed to have a partial circular arc shape and protruded in the direction A.

In the contact 21 of the embodiment, in accordance with the object to be contacted which is a soldering ball B having a curved surface, the contacting portions 22a are formed to have the partial circular arc shape, respectively, along a circumferential direction of a circle so that the contact connection can be ensured. Similarly for the second end portions 23, when the substrate E side of the test device is provided with the soldering balls B, the contact connection can be ensured.

Figure 10:
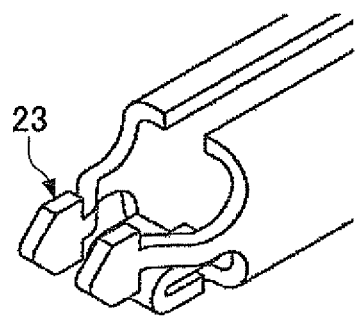
FIG. 10 is a perspective view showing a part of another example of the contact of the embodiment.

Further, when through holes or pads are provided at the substrate E side, the end portions of the second end portions 23 are formed to be choked with respect to the roots, respectively, as shown in FIG. 10 so that the end portions can be easily inserted into the respective through hole while increasing contacting points to ensure the contact connection.

Figure 11:
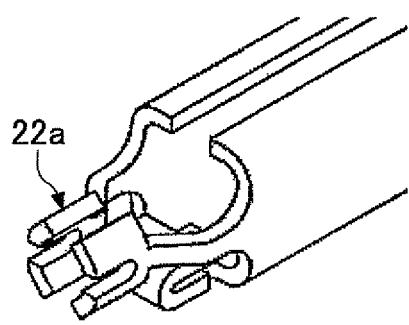
FIG. 11 is a perspective view showing a part of another example of the contact of the embodiment.

In order to further ensure the contact connection with the soldering ball B of the object to be contacted, four contacting portions 22a each having a partial circular arc shape may be provided at four points on the periphery of the circle, as shown in FIG. 11.

The contact and the connector including the contact according to the embodiment are appropriately used for a test device used for testing various semiconductor devices as the contact is manufactured from a single plate without using a separated coil spring component.

As the contact of the embodiments can be manufactured by processing a single plate, it is possible to manufacture the contact with a lower cost within a short period of time without assembling or jointing plural components. Especially, the contact is configured to have a spring function capable of pushing the first end portion and the second end portions toward the opposing direction without including a separated spring component. Further, according to the contact of the embodiment, it is possible to elongate or arbitrary set a length of the elastic portion within a cross-sectional surface so that the degree of freedom in setting the spring constant can be increased. Further, by using plural of the contacts, according to the present embodiment, a connector having a high reliability capable of being manufactured with a lower cost can be provided.

Although a preferred embodiment of the contact and the connector has been specifically illustrated and described, it is to be understood that minor modifications may be made therein without departing from the spirit and scope of the invention as defined by the claims.

The present invention is not limited to the specifically disclosed embodiments, and variations and modifications may be made without departing from the scope of the present invention.

For example, a part of the first end portion 2 other than a contacting portion to be in contact with the object to be contacted may be formed to have a polygonal shape although a circular shape is exemplified in FIG. 3C or the like in the cross-sectional view seen from the direction D. Similarly, an outer peripheral shape of the housing portion 5 may be a polygonal shape having more sides than a tetragonal shape although a circular shape is exemplified in FIG. 1B or the like in the cross-sectional view seen from the direction D.

The present application is based on and claims the benefit of priority of Japanese Priority Application No. 2012-089449 filed on Apr. 10, 2012, the entire contents of which are hereby incorporated by reference.

What is claimed is:

1. A contact for electrically connecting two electric components positioned to face with each other in a first direction, the contact comprising:
   a first end portion which contacts an object to be contacted;
   a second end portion for passing a signal from the first end portion, the second end portion being positioned at an opposing end from the first end portion in the first direction;
   an elastic portion provided between the first end portion and the second end portion to connect the first end portion with the second end portion while pushing the first end portion and the second end portion in an opposing direction along the first direction,
   the elastic portion having a meandering shape from the first end portion to the second end portion,
   the elastic portion having a curved/bent structure that is curved/bent around a center line of the contact extending along the first direction to provide an open portion between front edges of the curved/bent structure when seen in the first direction such that a width of the open portion is different from the maximum inner width of the curved/bent structure when seen in the first direction; and
   a housing portion which surrounds the elastic portion,
   wherein the first end portion, the second end portion, the elastic portion and the housing are formed by bending a single conductive plate.

2. The contact according to claim 1, wherein the curved/bent structure of the elastic portion is a polygonal shape or a circular shape when seen in the first direction.

3. The contact according to claim 1, wherein an outer peripheral shape of the housing portion is a polygonal shape having more sides than a tetragonal shape or a circular shape when seen in the first direction.

4. The contact according to claim 1, wherein the second end portion is provided at an end of the housing portion to be protruded from the housing portion, the second end portion being choked at an end portion with respect to the root.

5. The contact according to claim 1, wherein a part of the first end portion other than a portion to be in contact with the object to be contacted is formed to have a polygonal or a circular shape cross-sectional shape when seen in the first direction.

6. The contact according to claim 1, wherein the second end portion is formed to include plural end portions each provided at an end of the housing portion to be protruded from the housing while being bent to be closer with each other.

7. The contact according to claim 1, wherein the first end portion includes plural contacting portions.

8. The contact according to claim 7, wherein the plural contacting portions are bent to be closer with each other.

9. The contact according to claim 7, wherein the plural contacting portions are provided to be positioned on a peripheral of a circle when seen in the first direction.

10. The contact according to claim 9, wherein each of the plural contacting portions is formed to have a circular arc shape extending along the peripheral of the circle when seen in the first direction.

11. The contact according to claim 1, wherein the second end portion is formed to include plural end portions each having a circular arc shape extending along a peripheral of a circle when seen from an end portion side of the second end portion.

12. The contact according to claim 1, further comprising:
a connecting portion which connects an end of the housing portion and an end of the elastic portion,
the first end portion being connected to the other end of the elastic portion and
the second end portion being provided at the end of the housing portion to be protruded from the housing.

13. A connector comprising:
a housing; and
a plurality of contacts provided in the housing, for electrically connecting two electric components positioned to face with each other in a first direction,
each of the contacts comprising
a first end portion which contacts an object to be contacted,
a second end portion for passing a signal from the first end portion,
the second end portion being positioned at an opposing end from the first end portion in a first direction,
an elastic portion provided between the first end portion and the second end portion to connect the first end portion with the second end portion while pushing the first end portion and the second end portion in an opposing direction along the first direction,
the elastic portion having a meandering shape from the first end portion to the second end portion,
the elastic portion having a curved/bent structure that is curved/bent around a center line of the contact extending along the first direction to provide an open portion between front edges of the curved/bent structure when seen in the first direction such that a width of the open portion is different from the maximum inner width of the curved/bent structure when seen in the first direction, and
a housing portion which surrounds the elastic portion,
wherein the first end portion, the second end portion, the elastic portion and the housing are formed by bending a single conductive plate.

14. The contact according to claim 1, wherein the open portion is a portion where the elastic portion does not exist.

15. The contact according to claim 1, wherein the width of the open portion is smaller than the maximum inner width of the curved/bent structure.

16. The connector according to claim 13, wherein the open portion is a portion where the elastic portion does not exist.

17. The connector according to claim 13, wherein the width of the open portion is smaller than the maximum inner width of the curved/bent structure.

* * * * *